(12) United States Patent
Cramer et al.

(10) Patent No.: US 7,916,927 B2
(45) Date of Patent: Mar. 29, 2011

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Hugo Augustinus Joseph Cramer, Eindhoven (NL); Antoine Gaston Marie Kiers, Veldhoven (NL); Durk Oeds Van Der Ploeg, Nuenen (NL); Goce Naumoski, Veldhoven (NL); Roland Mark Van Weel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1031 days.

(21) Appl. No.: 11/653,441

(22) Filed: Jan. 16, 2007

(65) Prior Publication Data

US 2008/0170780 A1    Jul. 17, 2008

(51) Int. Cl.
*G06K 9/00* (2006.01)
*G06K 9/62* (2006.01)

(52) U.S. Cl. .................................. 382/141; 382/209

(58) Field of Classification Search .................. 382/141, 382/145, 209, 218, 284, 203
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,650,422 B2 * | 11/2003 | Singh et al. | 356/601 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |

(Continued)

FOREIGN PATENT DOCUMENTS

JP    06-117844 A    4/1994

(Continued)

OTHER PUBLICATIONS

English language abstract of Japanese Patent Publication No. JP 06-117844 A, Japanese Patent Office, published Apr. 28, 1994; 1 page.

(Continued)

*Primary Examiner* — Daniel G Mariam
(74) *Attorney, Agent, or Firm* — Sterne, Kessler, Goldstein & Fox P.L.L.C

(57) ABSTRACT

Building of a model profile for a target is disclosed. An embodiment of the method includes importing an image of a known object and superimposing, on this image, either by hand or automatically, an estimated profile. The estimated profile is defined mathematically and adjusted segment by segment in order to match the image such that the adjusted estimated profile may be stored alongside a diffraction spectrum associated with the image. Alternatively or additionally, a user may trace (or free-draw) the profile of a known image and subsequently map a shape-definer of a mathematical function such as a polynomial equation, a spline or a vector onto the estimated profile in order to obtain a profile and one or more variables of that profile that may be used to reconstruct the profile of an unknown object from its diffraction pattern.

20 Claims, 4 Drawing Sheets

U.S. PATENT DOCUMENTS

| | | | |
|---|---|---|---|
| 6,819,426 B2 | 11/2004 | Sezginer et al. | 356/401 |
| 6,856,408 B2 | 2/2005 | Raymond | 356/601 |
| 6,891,626 B2 | 5/2005 | Niu et al. | |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,375 B2 * | 5/2006 | Bischoff et al. | 356/600 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 7,092,110 B2 * | 8/2006 | Balasubramanian et al. | 356/625 |
| 7,281,810 B2 * | 10/2007 | Lee | 359/850 |
| 7,330,279 B2 | 2/2008 | Vuong et al. | |
| 7,515,282 B2 * | 4/2009 | Li et al. | 356/625 |
| 2003/0028358 A1 | 2/2003 | Niu et al. | 703/2 |
| 2004/0119970 A1 | 6/2004 | Dusa et al. | 356/237.1 |
| 2004/0210402 A1 | 10/2004 | Opsal et al. | 702/28 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |

FOREIGN PATENT DOCUMENTS

| | | |
|---|---|---|
| JP | 07-210679 A | 8/1995 |
| JP | 2001-084403 A | 3/2001 |
| JP | 2005-534192 A | 11/2005 |

OTHER PUBLICATIONS

English language abstract of Japanese Patent Publication No. JP 07-210679 A, Japanese Patent Office, published Aug. 11, 1995; 1 page.

English language abstract of Japanese Patent Publication No. JP 2001-084403 A, Japanese Patent Office, published Mar. 30, 2001; 1 page.

English language abstract of Japanese Patent Publication No. JP 2005-534192 A, Japanese Patent Office, published Nov. 10, 2005; 1 page.

English translation of Japanese Decision of Rejection directed to related Japanese Patent Application No. 2008-002186, mailed Dec. 21, 2010 from the Japan Patent Office; 2 pages.

English translation of Israeli Office Action directed to related Israeli Patent Application No. 188768, mailed Dec. 7, 2010 from the Israeli Patent Office, Israel; 5 pages.

* cited by examiner

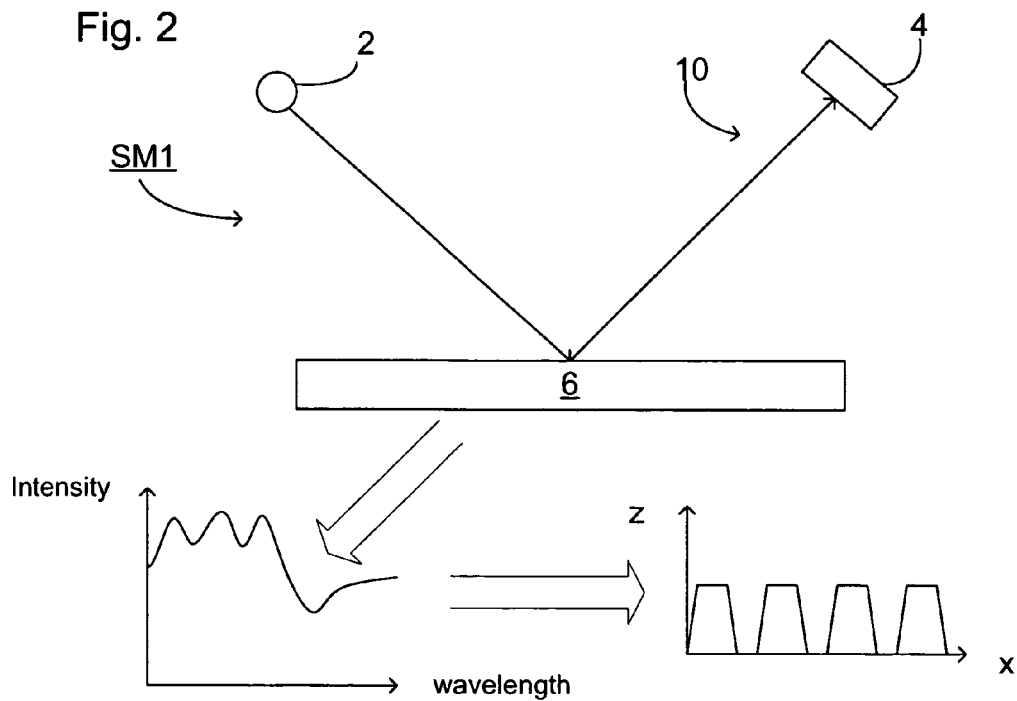
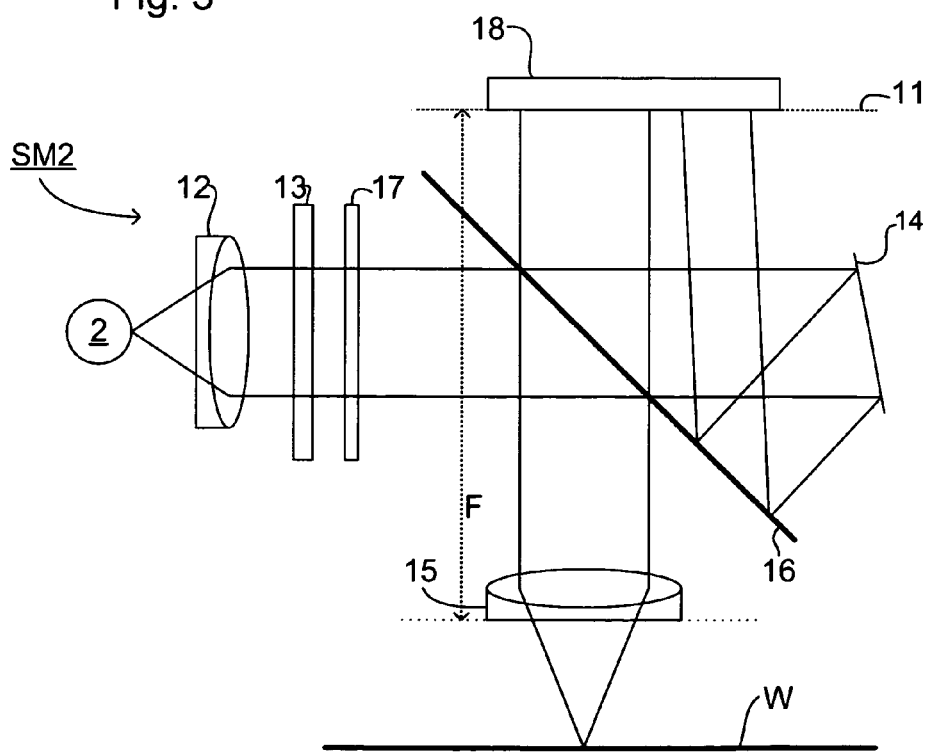

INSPECTION METHOD AND APPARATUS, LITHOGRAPHIC APPARATUS, LITHOGRAPHIC PROCESSING CELL AND DEVICE MANUFACTURING METHOD

FIELD

The present invention relates to a method of inspection usable, for example, in the manufacture of devices by a lithographic technique and to a method of manufacturing devices using a lithographic technique. Specifically, the present invention refers to the inspection of the devices manufactured using a lithographic technique and the reconstruction of an object on the devices from its diffraction pattern.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle. An ellipsometer measures polarization state.

In order that the radiation that impinges on to the substrate is diffracted, an object with a specific shape is printed on to the substrate and is often known as a scatterometry target. The object may be a diffraction grating or the like which is made up of an array of bars or other periodic structures having a cross-section which is known as the profile. Indeed, the profile is typically a repeating set of similar structures such as resist lines. The average profile of one such repeating structure (or unit cell) is called "the profile". The actual profile of the object is hence a concatenation of a number of unit cells, which may contain local variations.

The profile is generally measured from the surface of the substrate and may include one or more product layers on which an object is deposited. Ideally, the object that is printed on to the substrate would have a predetermined shape and would be printed perfectly each time it was printed. In practice, however, the printed shape and size of the object may deviate from the ideal shape, predominantly because of the difficulty in creating accurate shapes at the small size of the object involved. It is desirable to have a system to determine how exactly the object is shaped.

As mentioned above, it is possible to determine the actual shape of a scatterometry object using a cross-section scanning electron microscope and the like. However, this involves a large amount of time, effort and specialized apparatus and is less suited for measurements in a production environment because a separate specialized apparatus is required in line with normal apparatus in, for example, a lithographic cell.

Another way to determine the profile of a scatterometry object is to diffract a beam of radiation from the object and compare the diffraction pattern with model diffraction patterns that are stored in a library of diffraction patterns alongside the model profiles that create these model patterns.

In addition to using a library of model diffraction patterns, there are further methods that either do not use a library or that are used in combination with a library. One such method is an iterative method, where the parameters are given a starting value and the diffraction pattern of these starting values is calculated and compared with the measured diffraction pattern. The values of the parameters are then iteratively changed to improve the match between the iteratively modeled and measured diffraction patterns.

SUMMARY

U.S. patent application publication no. US 2003/0028358 A1 (Niu et al.), for example, describes a system in which an actual signal from a scatterometry object is compared with a library of stored signals and the system tries to find a closest match of signals. The stored signals are each linked to an object profile parameter. An object profile parameter may be, for instance, the critical dimension (CD), a width of the object (which may vary with height), the height of the object or the angle of a side surface (or "sidewall") of the object (this angle being measured either from the surface of the substrate or from a normal to the substrate surface). The document goes on to describe the method of finding a closest match between the measured signal and a calculated signal of a model of the scatterometry object where the shape of the model depends on the values of the profile parameters in the model. In other words, various possible sets of parameter values are tested to find a set that gives rise to a signal that is as close to the actual signal that has come from the scatterometry object as possible. This gives a series of iterations of a "model signal". This method is repeated iteratively until the model signal is as close as possible to the actual signal and then the model signal is stored alongside the parameters used.

In a given example, for a simplified parameter set of three (CD, height and width), if the range of the CD is 100 to 120 nm and the resolution is 1 nm, then there are 21 possible parameter values for CD. If there are also 21 possible values for height and 21 possible values for width, there are a total of 21×21×21=9261 possible parameter value combinations. The computer checks to see if all 9261 combinations have been simulated and stored in the database. The computer builds the database by simulating all of the possible combinations. Clearly, the problem with this system is that the greater the number of parameters, the greater the number of iterations that the computer must carry out and the greater the processing power and time that is required.

U.S. patent application publication no. US 2004/0210402 A1 (Opsal et al.) describes a system that aims to reduce the number of parameters required to build up the profile of an object from the scatterometry signals. The way the system does this is by providing "control points" around the outside of the profile shape from which the profile shape may be built up. For example, a square-profiled object has a single control point to show its height from the substrate surface and two points to show a width. The points are then joined up in a "dot-to-dot" fashion to give a line profile. The more complex the shape, the larger the number of control points is required to build up an accurate line profile. This system may not work well for overlapping shapes (e.g. complex shapes that look like overlapping simpler shapes or a profile that has a coating) or multiple shapes in a single profile, as the lines joining the dots may easily join the wrong dots.

Another problem with the system in US 2004/0210402 is that each control point will have at least one (if not two or three) degree of freedom. The greater the number of degrees of freedom, the greater the computing power is required to find the correct value for each of them.

The above systems only find a single profile. Further calculations are needed to find a "profile space", that is, a combination of a generic profile description with a number of profile parameters, and the possible ranges of those parameters. This combination builds up a specific profile space as required.

As an example, a user may choose to describe a profile by a trapezoid with parameters of width, height and sidewall angle. The user then defines ranges for these three parameters. More complex profiles are built in a similar fashion, for example, with more complex shapes or a series of trapezoids amalgamated together.

A problem with the profile building using shapes in this way is that the user has to define a profile space that is large enough and has a sufficient number of degrees of freedom to describe accurately the variation of a profile of an actual object on a substrate. Of course, the user may create a different profile space for each application (even when the object shape should theoretically be the same), but this is extremely time consuming. Furthermore, the larger the degree of freedom, the more difficult it is to find the optimal set of parameter values that will give rise to the best match between measured and modeled diffraction patterns.

The iterative method described above may be combined with or used instead of the library method. However, the problem outlined above of having to define a profile space is common to both methods. Too large a profile space means a large library, and so searching time in the library increases. Too large a profile space also means that a greater number of iterations must be performed to find a close match, which increases computing power required and time taken.

It is desirable, for example, to provide a system that assists a user in setting up a nominal profile and its variations that build a "profile space" by using all information available effectively. It is particularly desirable to assist a user in using information that is available "upfront" and includes cross-sections of profiles of objects exposed with a variety of exposure settings (focus, exposure dose or one or more other exposure parameters), profiles obtained by numerical simulation of the lithographic process, and/or profiles obtained by scatterometry using a large and flexible profile space.

It is desirable, for example, to provide a system that accurately recreates a profile of an object on a substrate from which diffractive radiation is detected using as little effort from a user and computing power during the measurements as possible.

It is desirable, for example, in target shape reconstruction, that model profiles have few degrees of freedom or few unknown parameters in order to determine efficiently and quickly the profile of a complex target on a substrate.

It is desirable, for example, to reduce the number of parameters that are used to describe the nominal profile and its variations.

It is desirable, for example, to reduce the range of possible values of these profile parameters. It is therefore desirable, for example, to have a thorough space of possible profiles that will either match the actual object profile or that will be usable to recreate the object profile accurately with as few variable parameters as possible. It is therefore desirable, for example, to create a useful profile model or profile space.

According to an aspect of the invention, there is provided a method of defining a profile such that the definition of the profile can be used to reconstruct profiles of objects from diffracted radiation from the objects, the method comprising:

defining a profile using information from a known object;

describing a surface of the profile using a mathematical function;

selecting a variable parameter in the mathematical function and varying the variable parameter iteratively until a calculated diffraction pattern of the profile matches the diffraction pattern of the known object; and storing the profile and the variable parameter.

By "matches", it is understood that the aim of the method is to obtain a profile that is as close as possible to the known object, within acceptable tolerances and within acceptable time and computing effort. By "profile", it is understood that if the object is 2-dimensional, the "surface" is its outline and if it is 3-dimensional, the surface is its surface area; and the profile is either the cross-section of an object or a profile space (i.e. a nominal profile plus its variables) as defined above.

According to another aspect of the invention, there is provided a method of defining a profile such that the definition of the profile can be used to reconstruct profiles of objects from diffracted radiation from the objects, the method comprising:

viewing an image of a known object;

superimposing an estimated profile onto the known object;

defining a variable parameter in the estimated profile;

varying the variable parameter iteratively until the estimated profile matches the known object; and storing the profile and the variable parameter.

According to yet another aspect of the invention, there is provided an inspection apparatus for defining a profile such that the definition of the profile can be used to reconstruct profiles of objects from diffracted radiation from the objects, the apparatus comprising:

an importer configured to import a profile of a known object;

a user interface configured to describe a surface of the profile using a mathematical function and to adjust a variable parameter in the mathematical function until the profile matches the known object; and a memory configured to store the profile and the variable parameter.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a first embodiment of a scatterometer;
FIG. 3 depicts a second embodiment of a scatterometer.

DETAILED DESCRIPTION

Figure 1A:
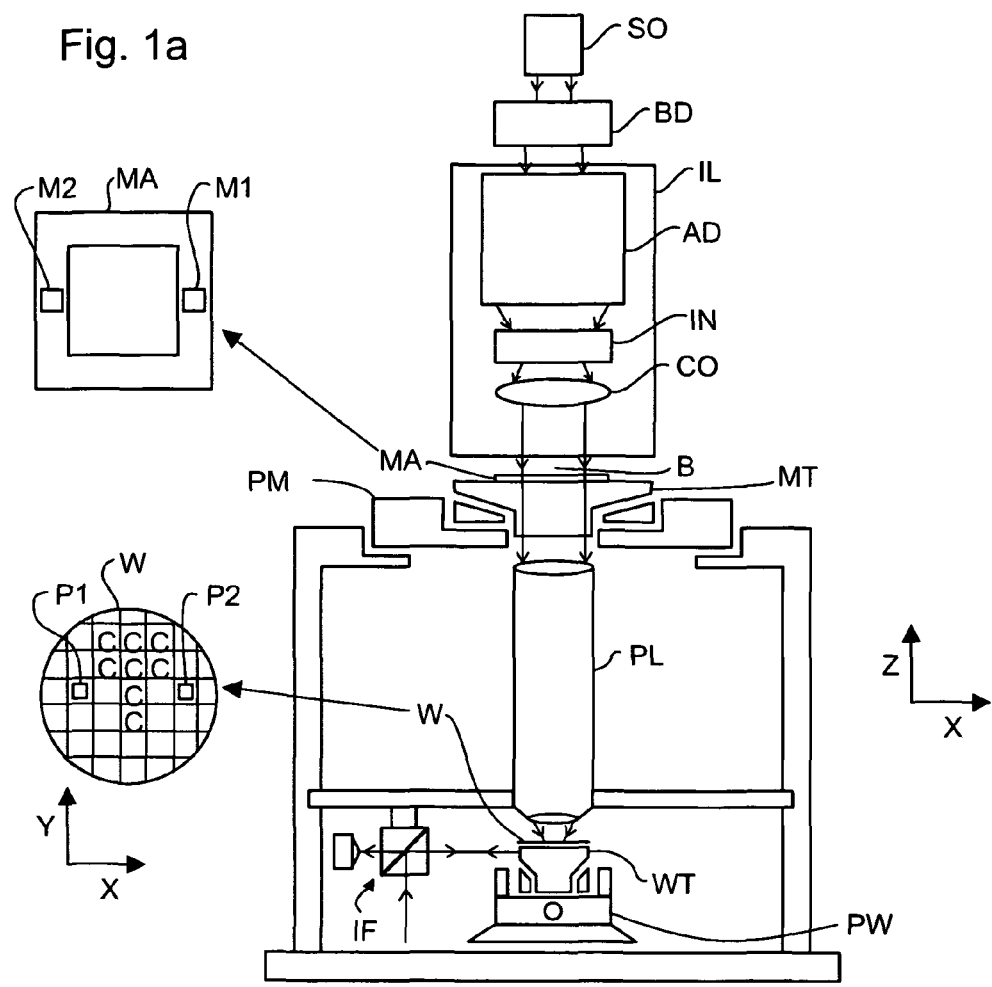
FIG. 1a depicts a lithographic apparatus.

FIG. 1a schematically depicts a lithographic apparatus. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
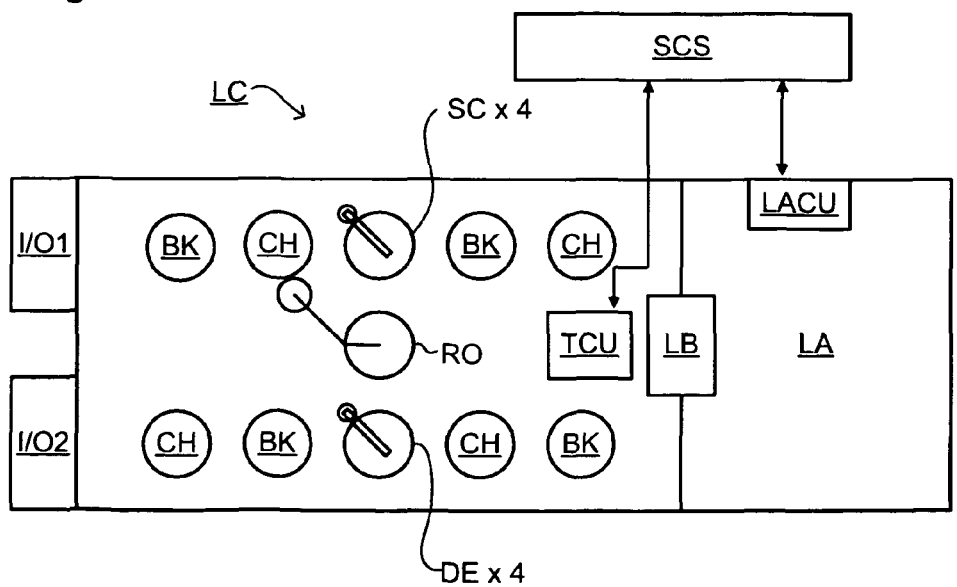
FIG. 1b depicts a lithographic cell or cluster.

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

FIG. 2 depicts a scatterometer SM1 which may be used in an embodiment of the invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer SM2 that may be used with an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered light at a single wavelength (or narrow wavelength range), the intensity separately at multiple wavelengths or the intensity integrated over a wavelength range. Further, the detector may separately measure the intensity of transverse magnetic-(TM) and transverse electric-(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit, from knowledge of the printing step and/or other scatterometry processes.

An embodiment of the invention relates to the reconstruction of the target on the substrate W. Where the target is a grating, the bars of the grating have a shape that includes their length and the shape of their cross section, as they are generally assumed to be prism-shaped. The cross-sectional shape of a bar is known as its profile. Hereafter, a bar will be referred to as a scatterometry object. It must be noted, however, that the profile may also comprise the entire 3-D object and not simply its cross-section. It must be noted that the profile may comprise not only the outer shape of the object, but also inner shapes, subdivision of the shapes, material and material properties.

For reconstruction purposes, the profile has previously been regarded as being made up of a stack of homogeneous rectangular cross-sectioned layers and trapezoids (or cylinders and cones for 3-D objects). However, an embodiment of the invention builds on this idea.

Generally, for the purposes of reconstructing an object profile from its diffraction spectrum, a radiation beam is diffracted from the surface of the scatterometry object. This diffracted beam is detected by a detector that then creates a scatterometry measurement signal from the diffraction pattern. The measurement signal is compared with a calculated signal that is based on a model profile. When the calculated signal does not match the measured signal, the model profile is altered so that the associated model signal is more similar to the actual profile of the actual object. This process is continued until the measurement signal and the calculated signal do match to within acceptable tolerances.

Alternatively, a model profile can be searched from a library of model profiles and associated model signals (e.g.

diffraction spectra). Interpolation within the library can be used to increase the accuracy of the model profile.

Specifically, an embodiment of the invention is concerned with defining and estimating the model profile space, that is, all model profiles that can be considered in order to find the best match (in order to enable a diffraction pattern of the model profile to be compared with the diffraction pattern of the actual object, and thus to obtain the actual profile of the object).

Figure 4:
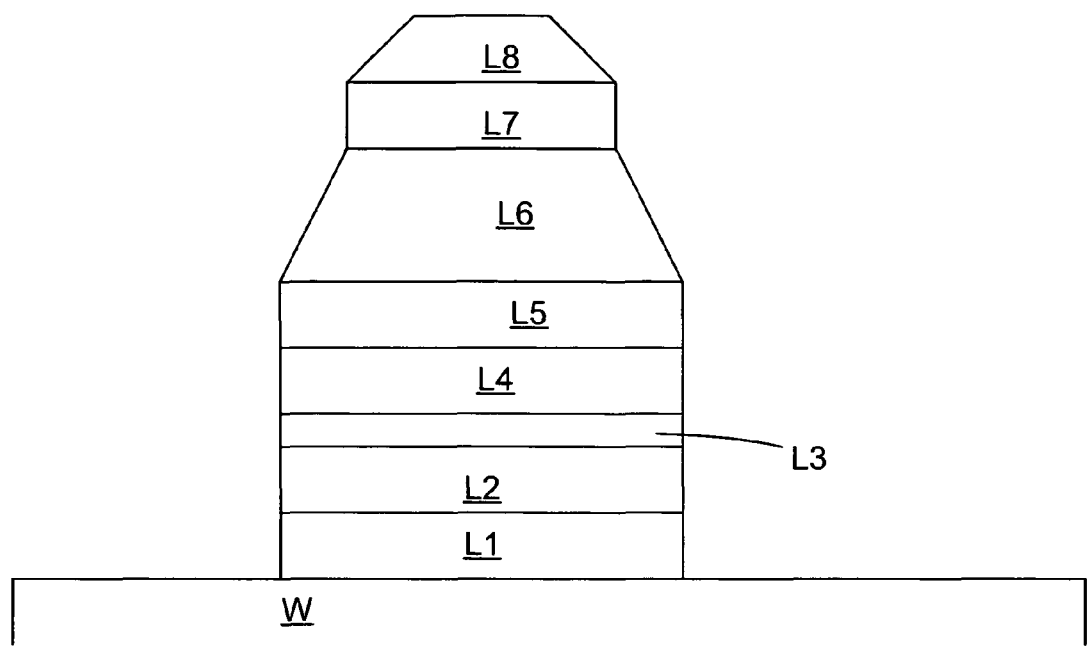
FIG. 4 depicts a reconstruction of an object profile.

FIG. 4 shows an example model profile. The profile is approximated to a stack of slabs L1-L5, L7 and trapezoids L6, L8. The degrees of freedom of the building blocks (width, height and side wall angle) could be adjusted in order to make the series of building blocks L1-L8 match the object profile as closely as possible. However, this method suffers from certain drawbacks. The first is that a user must be experienced to choose the number, shape and size of the building blocks correctly. Secondly, the degrees of freedom of the building blocks might not match with the actual variation in the profiles that are measured. Thirdly, the user has to define the range of the shapes and sizes that has to be considered to cover the variations in profiles that are to be measured. Finally, the building blocks method is only a very rough model of a real desired profile. The main reason for this is that the building blocks do not allow for curves in the surface of the profile.

The way model profiles are built according to an embodiment of the invention is that the outline of the profile is determined independently, rather than trying to build up the cross-section or volume of the object with building blocks. The outline of a 2-dimensional object or the surface of a 3-dimensional object can be described using various mathematical functions, such as polygons and splines. Alternatively, the user can use a drawing system to generate an outline by hand. In a later stage of this hand-drawn method, the outline may be approximated by mathematical functions once the hand drawing has been input into a computer or other processor.

Figure 5:
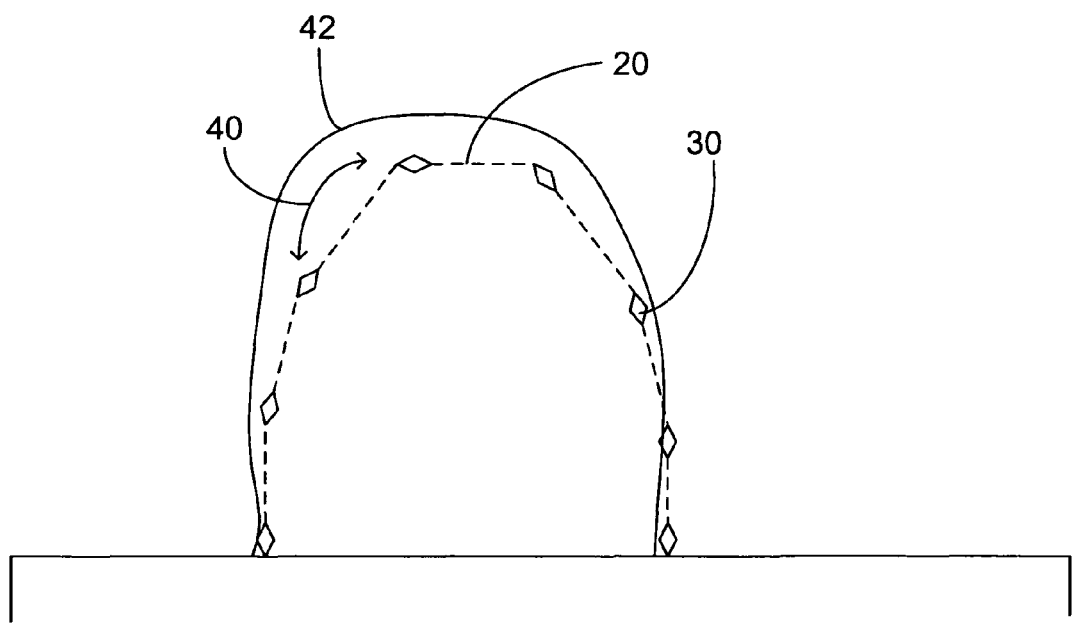
FIG. 5 depicts a model profile according to an embodiment of the invention.
Figure 6:
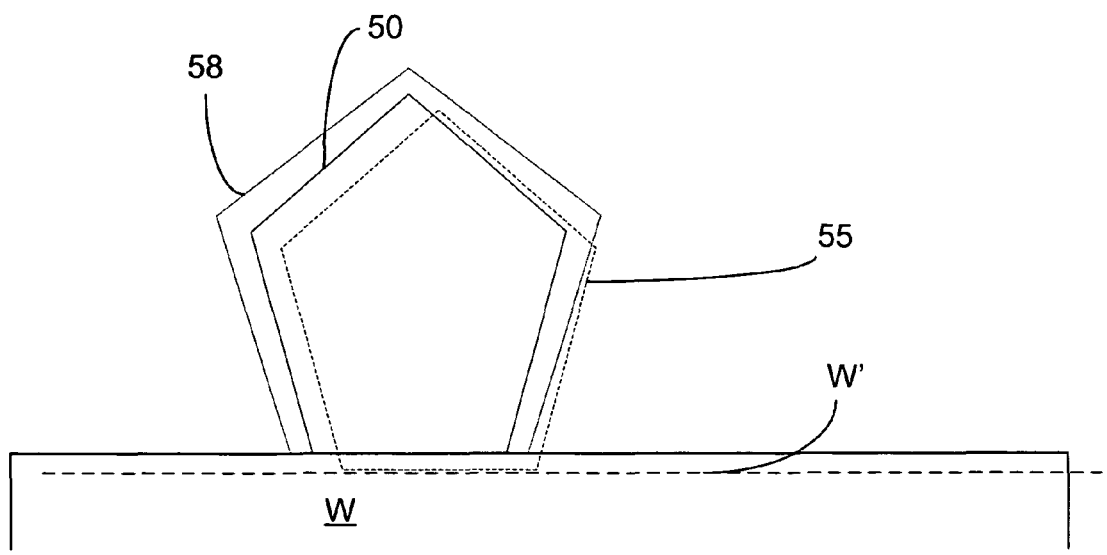
FIG. 6 depicts the superposition of a model profile with a known profile.

To aid the user in defining the outline, it is possible to use information on the object to be measured. As shown in FIG. 5, an image 42 of a known object is imported on to a screen which the model builder (or user) can see. A user interface then allows the user to superimpose an estimated profile 20 on top of the imported image. The estimated profile 20 may then be adjusted 40 to match the image 42 exactly and the parameters (i.e. the nominal profile and its variations) of the adjusted estimated profile are then stored in the library with the diffraction pattern of the imported image 42. The superposition of an estimated object 55 onto an actual image 50 is shown in FIG. 6. The relative position of the substrate surface W' is also aligned with the actual substrate surface W. Starting with an estimated profile 55 as shown in FIG. 6, in this case, the user need only shift the estimated profile to the left and slightly upwards in order for the estimated profile 55 to match the imported image 50.

The imported image 42;50 may be an object as determined from scanning electron microscopy (SEM), scanning atomic force microscopy (AFM), or the image may be imported from a lithographic prediction model (such as Lithocruiser or Prolith). The image may also be imported from any sort of simulation. Alternatively or additionally, the image may be imported from previous measurements, for example, previous measurements that contain a greater number of free parameters. In other words, a previous object profile that has undergone a large amount of processing to make it as accurate as possible may be used as the imported image.

As indicated above, there are alternative ways to define an estimated profile and profile space. One way is to superimpose a plurality of slabs and trapezoids to most closely match the imported image. This is similar to using slabs and trapezoids to build up the model, but the main difference is that the building blocks are visually compared with a known image, rather than being estimated from design information or user experience. A further alternative is for a user to free-draw a profile onto the imported image using a user interface and then to map splines, polynomial equations or vectors or other such representations once the free-drawing has been made by the user.

There are several ways in which the estimated profile may then be adjusted in order to match the imported image over which it is superimposed. FIG. 5 shows one example of this. "Handles" 30 on an estimated profile may be adjusted so that the segments 20 between the handles 30 may be moved independently of each other. Movement of the handles 30 may also cause a segment 20 to curve in a direction shown with reference numeral 40. The movement of the handles is then recorded as variations in mathematical functions representing the resultant change of the segment. These variations are then stored with the nominal profile (i.e. the profile created before the handles were manipulated).

Each of the segments 20 may be represented by a polynomial equation such that a desired curve may be achieved. Alternatively or additionally, the segment 20 may be represented by a vector so that its relative position is easily reproducible. Yet further, the segment 20 may be represented by a spline, which is also known as a "piecewise" polynomial curve.

Similarly, there are several ways for the user to define the profile space, that is, the way the profile may be adjusted and the amount by which it may be adjusted to find the best match of the measured and modeled diffraction pattern. Typically, the user will select one or more adjustment parameters or handles and indicate the degree of variation (i.e. the range) for the at least one parameter.

Figure 7:
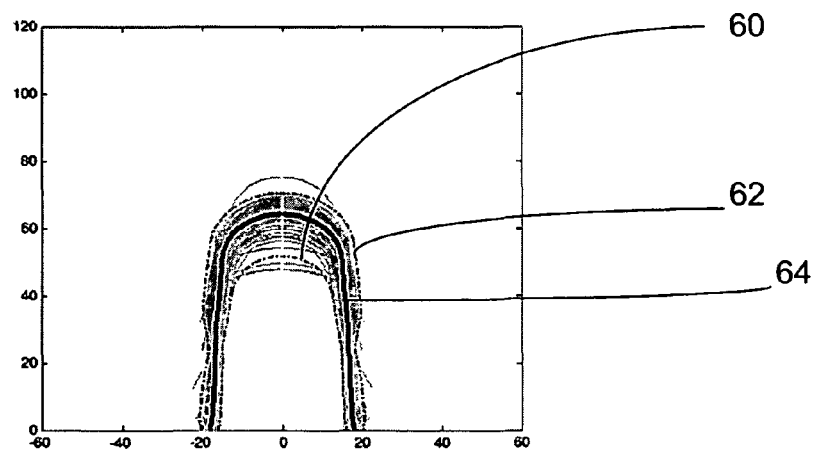
FIG. 7 depicts the use of multiple profile images according to an embodiment of the invention.

As shown in FIG. 7, a user may import a plurality of images from previous measurements if, for example, a number of diffraction spectra from test substrates with various scatterometry objects has given rise to a plurality of potential profiles. These profiles may have been determined by various cross-section techniques, such as SEM, TEM (transmission electron microscopy) or AFM, or even using scatterometry with a model profile with a large number of variable parameters. These profiles may all be superimposed on top of each other. If these multiple profile images are available, the multiple images may be analyzed and the user may find a mean profile 64 and also a profile variation, e.g. a variation with a 5% percentile line 60 and a 95% percentile line 62. The variation can be analyzed statistically to determine a minimum set of profile functions that can accurately describe the profile variations. The benefit of this is that noise in the images may be reduced, and the number of variable parameters to describe accurately the most significant shape is as low as possible. This can be achieved, for instance, using Principle Component Analysis.

A further benefit of an embodiment of the invention is that not only a simple outline profile may be recorded, but the process may be used for more complex objects such as an objects with a coating, a contact hole, a layered object, or any kind of object that may occur as a product of a test structure.

The imported image, as mentioned above, may be made up of any number of available images and so compound images may be used on which to superimpose an estimated profile that represents an object with a coating or the like. For example, the object 50 of FIG. 6 may be combined with an image 58 that is the same shape but slightly larger. The superimposed profile 55 may then be calculated or determined twice; once for the object shape 50 and once for the slightly larger image (e.g., of a coating) 58, thereby giving, for example, the profile for a coated object.

The examples above refer to the use of a user interface for manually superimposing an estimated profile on to an imported image. However, this may be done automatically with a combination of software and hardware that recognizes or detects the edges of objects and creates a profile for this edge.

An embodiment of the invention is not limited to two-dimensional profiles. The same method of superimposing an estimated profile and adjusting it could be applied to an object, for example, in orthogonal directions. A series of profiles can then be determined to build up a 3D object.

Furthermore, it is not necessary for an estimated profile to match a single imported object exactly. If a family of objects has at least one parameter in common (for example the pentagonal shape 50 as shown in FIG. 6), an index profile may be created that contains the at least one common parameter (e.g. pentagon), thus reducing the number of parameters that will need to be measured for this particular family of objects. Continuing the example of FIG. 6, if a family of objects contains the same pentagonal shape 50, but with different heights 58 and position 52, the same index profile 50 may be used for the whole family, with only two unknown parameters, namely height and position. Software may automatically convert an imported image to a single, or a series of, polynomial equation(s) or spline(s).

The matching up of an estimated profile with an imported object may be done freehand by a user or automatically with edge detection software or it may be done pixel by pixel by a user.

The advantage of embodiment of the invention is that a profile can be defined more easily, and that the space of potential model profiles is more accurate and thorough such that the reconstruction of object profiles can be carried out more accurately and more easily and with a minimum number of degrees of freedom (or unknown parameters).

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. A method, comprising:
defining, using a processing device, a nominal profile based on information from a known object;
describing a surface of the nominal profile using a mathematical function;
generating, using the processing device, an estimated profile from the mathematical function;
defining a plurality of variable parameters of the mathematical function and their ranges to describe a profile space;
selecting a variable parameter from the plurality of variable parameters within the profile space in the mathematical function;
varying the variable parameter iteratively until a calculated diffraction pattern of the estimated profile matches the diffraction pattern of the known object; and
storing, using the processing device, the estimated profile and the variable parameter.

2. The method of claim 1, wherein describing the surface of the nominal profile comprises dividing an outline of a 2-dimensional profile into segments, each segment being represented by at least one shape-definer selected from the group consisting of:
a line,
a polygon,
a slab,
a curve,
a polynomial equation,
a vector,
a pre-prepared shape and a spline.

3. The method of claim 1, wherein describing the surface of the nominal profile comprises dividing the surface of a 3-dimensional profile into segments, each segment being represented by at least one shape-definer selected from the group consisting of:
a polygon,
a slab,
a curve,
a polynomial equation,
a vector,
a pre-prepared shape and a spline.

4. The method of claim 1, wherein the known object is an imported image of an object.

5. The method of claim 4, wherein the imported image is obtained using a metrology tool.

6. The method of claim 5, wherein the metrology tool is a scanning electron microscope, an atomic force microscope, or a scatterometer.

7. The method of claim 4, wherein the imported image is obtained using a simulation of an object.

8. The method of claim 4, wherein the imported image is a combination of a plurality of images of known objects.

9. The method of claim 8, wherein a mean or otherwise averaged profile of the plurality of images is used, a variation in the profile is determined, and the variation is statistically analyzed to determine a minimum number of mathematical functions that are required to describe the profile and the variation within the profile to within a desired accuracy level.

10. The method of claim 4, wherein the describing and the varying is carried out by a user using a user interface and an image processor.

11. The method of claim 4, wherein the describing is carried out automatically using automated edge detection of the object.

12. A method, comprising:
supplying, using a processing device, an image of a known object;
superimposing, using the processing device an estimated profile onto the known object;
defining a plurality of variable parameters of the mathematical function and their ranges to describe a profile space;
selecting a variable parameter from the plurality of variable parameters within the profile space associated with the estimated profile;
varying the variable parameter iteratively until the estimated profile matches the known object; and
storing, using the processing device, the estimated profile and the variable parameter.

13. The method of claim 12, wherein the estimated profile is 3-dimensional and comprises at least one shape definer selected from the group consisting of:
a polygon,
a slab,
a curve,
a polynomial equation,
a vector,
a pre-prepared shape and a spline.

14. The method of claim 12, wherein the estimated profile is 2-dimensional and comprises at least one shape definer selected from the group consisting of:
a line,
a polygon,
a slab,
a curve,
a polynomial equation,
a vector,
a pre-prepared shape and a spline.

15. The method of claim 12, wherein the estimated profile comprises a handle and varying the variable parameter of the estimated profile comprises manipulating the handle on the estimated profile so as to adjust a shape of the profile in the vicinity of that handle.

16. A method of reconstructing a profile of an object from a diffraction pattern resulting from radiation illuminating the object, the method comprising:
detecting the diffraction pattern of radiation diffracted from the object;
generating a model profile from the diffraction pattern, comprising:
defining, using a processing device, a nominal profile using information from a known object,
describing a surface of the nominal profile using a mathematical function,
generating, using the processing device, an estimated profile from the mathematical function,
defining a plurality of variable parameters of the mathematical function and their ranges to describe a profile space,
selecting a variable parameter from the plurality of variable parameters within the profile space in the mathematical function, and
varying the at least one variable parameter iteratively until a calculated diffraction pattern of the estimated profile matches the diffraction pattern of the known object;
deriving a model diffraction pattern from the model profile;
comparing, using the processing device, the model diffraction pattern and the detected diffraction pattern; and
determining, using the processing device, an estimate of the object profile from the difference between the model diffraction pattern and the detected diffraction pattern.

17. A method of reconstructing a profile of an object from a diffraction pattern resulting from radiation illuminating the object, the method comprising:
detecting the diffraction pattern of radiation diffracted from the object;
generating, using a processing device, a model profile from the diffraction pattern, comprising:
supplying, using the processing device, an image of a known object,
superimposing, using the processing device, an estimated profile onto the known object,
defining a plurality of variable parameters of the mathematical function and their ranges to describe a profile space,
selecting a variable parameter from the plurality of variable parameters within the profile space associated with the estimated profile, and
varying the at least one variable parameter iteratively until the estimated profile matches the known object;
deriving a model diffraction pattern from the model profile;
comparing, using the processing device, the model diffraction pattern and the detected diffraction pattern; and
determining, using the processing device, an estimate of the object profile from the difference between the model diffraction pattern and the detected diffraction pattern.

18. An inspection apparatus for defining a profile such that the definition of the profile can be used to reconstruct profiles of objects from diffracted radiation from the objects, the apparatus comprising:
an importer configured to import a profile of a known object;
a user interface configured to describe a surface of the profile using a mathematical function, to select a plurality of variable parameters of the mathematical function and their range thus defining a profile space, and to adjust a variable parameter from the plurality of variable parameters in the mathematical function until the profile matches the known object; and
a memory configured to store the profile and the variable parameter.

19. The inspection apparatus of claim 18, wherein the user interface is configured to enable a user to divide the surface of a 3-dimensional profile into segments, each segment being represented by at least one shape definer selected from the group consisting of:
a polygon,
a slab,
a curve,
a polynomial equation,
a vector,
a pre-prepared shape and a spline.

20. The inspection apparatus of claim 18, wherein the user interface is configured to enable a user to divide the surface of a 2-dimensional profile into segments, the surface being the outline of the profile and each segment being represented by at least one shape definer selected from the group consisting of:

a line,
a polygon,
a slab,
a curve,
a polynomial equation,
a vector,
a pre-prepared shape and a spline.

* * * * *